(12) United States Patent
Salama et al.

(10) Patent No.: US 6,768,180 B2
(45) Date of Patent: Jul. 27, 2004

(54) SUPERJUNCTION LDMOST USING AN INSULATOR SUBSTRATE FOR POWER INTEGRATED CIRCUITS

(76) Inventors: C. Andre T. Salama, 66 Castlewood Road, Toronto, Ontario (CA), M5N 2L2; Sameh Khalil Nassif, 222 Elm St., Apt. #200, Toronto, Ontario (CA), M5T 1K5

( * ) Notice: Subject to any disclaimer, the term of this patent is extended or adjusted under 35 U.S.C. 154(b) by 0 days.

(21) Appl. No.: 10/117,698

(22) Filed: Apr. 4, 2002

(65) Prior Publication Data

US 2003/0190789 A1 Oct. 9, 2003

(51) Int. Cl.[7] .................................. H01L 29/76
(52) U.S. Cl. .................. 257/401; 257/213; 257/141; 257/341; 257/347; 257/493
(58) Field of Search ................... 257/213, 141, 257/341, 347, 401, 493

(56) References Cited

U.S. PATENT DOCUMENTS

| | | | | |
|---|---|---|---|---|
| 4,626,879 A | * | 12/1986 | Colak | 257/336 |
| 5,216,275 A | * | 6/1993 | Chen | 257/493 |
| 5,438,215 A | * | 8/1995 | Tihanyi | 257/401 |
| 5,482,870 A | * | 1/1996 | Inoue | 438/151 |
| 6,097,063 A | * | 8/2000 | Fujihira | 257/339 |
| 6,376,880 B1 | * | 4/2002 | Holst | 257/347 |

* cited by examiner

*Primary Examiner*—Vu A. Le
*Assistant Examiner*—Doug Menz
(74) *Attorney, Agent, or Firm*—Rossi & Associates

(57) ABSTRACT

A SJ-LDMOST device offers significantly improved on-state, off-state, and switching characteristics of lateral power devices for power integrated circuits applications. The device is fabricated on an insulator substrate. The proposed structure achieves charge compensation in the drift region by terminating the bottom of the SJ structure by a dielectric hence eliminating the undesirable vertical electric field component and preventing any substrate-assisted-depletion. The device structural arrangement thereby achieve a uniform distribution of the electric field thus maximizing the BV for a given drift region length.

7 Claims, 15 Drawing Sheets

$L_D = 66\mu m$
$h = 5\mu m$
$d = 1.2\mu m$
$N_A = N_D = 2 \times 10^{16} cm^{-3}$
$N_{Sub} = 1.2 \times 10^{14} cm^{-3}$

SUPERJUNCTION LDMOST USING AN INSULATOR SUBSTRATE FOR POWER INTEGRATED CIRCUITS

FIELD OF THE INVENTION

This invention relates in general to a superjunction lateral double diffused metal oxide semiconductor field effect transistor (SJ-LDMOST) device fabricated on an insulator substrate. More specifically, the invention provides a device having improved on-state, off-state, and switching characteristics of lateral power devices for power integrated circuits applications.

BACKGROUND OF THE INVENTION

The performance of power integrated circuits (PICs) relies heavily on the on-state and off-state characteristics of a family of lateral power metal oxide semiconductor field effect transistors (MOSFETs), termed lateral double diffused MOSFETs (LDMOSTs), that utilize the reduced surface field technique (RESURF) to achieve high breakdown voltage while maintaining low on-resistance. For a detailed description of RESURF lateral device technology refer to J. A. Appels and H. M. J. Vaes, "High Voltage Thin Layer Devices (RESURF Devices)", IEEE International Electron Device Meeting (IEDM), Dig. Tech Papers, pp. 238–241, 1979; incorporated herein by reference. The cross-section of a RESURF LDMOST device 10 implemented in a bulk p− type substrate 12 is shown in FIG. 1. The device 10 is typically fabricated on a thin epitaxial layer 14 to enhance the vertical depletion of the drift region 16. The device 10 further includes a source electrode 18, a drain electrode 20, a gate electrode 22, a polysilicon gate 24, a gate oxide layer 26, a field oxide layer 28, an n+ type source contact region 30, an n+ type drain contact region 32, and a p+ layer 34. Electrical isolation between adjacent devices is achieved by junction isolation (JI) where a reverse bias is applied to the p+ layer 34 at the source electrode 18.

In RESURF LDMOST devices, the specific on-resistance increases with the breakdown voltage due to the increase of the low doped drift region length $L_D$. Optimum breakdown voltage is achieved provided that the product of the doping concentration $N_D$ and the thickness of the epitaxial layer, $t_{epi}$, is in the order of 1 to $2 \times 10^{12}$ cm$^{-2}$ (known as the RESURF condition) which puts a limit on the upper bound of the doping concentration in the drift region and hence the minimum achievable specific on-resistance. Nevertheless breakdown voltages up to 1200V have been achieved using the RESURF technique and modifications of the technique such as a double RESURF device 36 structure, which includes a p− region 38 in the surface of the n− drift region 16, as shown in FIG. 2. For a detailed description of double RESURF technology, see J. S. Ajit, D. Kinzer and M. Ranjan," 1200V High-Side Lateral MOSFET in Junction-Isolated Power IC Technology Using Two Field Reduction Layers", Proceedings of the 5th International Symposium on Power Semiconductor Devices and ICs (ISPSD), Proceedings, pp. 230–235, 1993; incorporated herein by reference.

The RESURF LDMOST may be fabricated on a silicon-on-insulator (SOI) substrate 40 as shown in FIG. 3. The technology is known as dielectrically isolated (DI) silicon technology. The dielectric isolation is achieved by inserting a buried oxide (BOX) layer 42 between the substrate 44 and the epitaxial layer 46, while lateral isolation 48 is carried out by either local oxidation of thin silicon films (LOCOS) or by trench etching and refilling the trench with a dielectric. Power devices and low voltage components in a PIC may be implemented in silicon islands that are completely surrounded by a dielectric allowing higher packing density. Other advantages provided by DI silicon technology include reduced leakage currents and low parasitic capacitances.

For RESURF LDMOST in SOI the vertical depletion in the drift region 16 is due to a field effect action through the intermediate BOX layer 42. The BV in this case is dependent on the charge in the top silicon epitaxial layer 46 as specified by the RESURF condition, the silicon layer thickness under the n+ diffusion, and the BOX thickness. Devices with uniform lateral electric field distribution are realized by using a laterally linear doping profile in the drift region resulting in BV of 860V for a silicon film thickness of 0.2 $\mu$m and a BOX thickness of 4.4 $\mu$m. For a detailed description of this type of device see S. Merchant, E. Arnold, H. Baumgart, R. Egloff, T. Letavic, S. Mukherjee, and H. Pein, "Dependence of Breakdown Voltage on Drift Length and Buried Oxide Thickness in SOI RESURF LDMOS Transistor", Proceedings of the 5th International Symposium on Power Semiconductor Devices and ICs (ISPSD), Proceedings, pp. 124–128, 1993; incorporated herein by reference. Higher BV in DI technology requires thicker BOX layers, however, overly thick BOX layers may cause wafer warpage and bending, in addition, the effects of self-heating become more pronounced as the BOX thickness increases due to poor thermal conductivity of the oxide.

In high voltage LDMOSTs, the drift region resistance dominates the total on-resistance of the device. For breakdown voltages over 1200V the specific on-resistance of the LDMOST is impractically large. Therefore for further development of high voltage LDMOSTs, the emphasis has been to reduce the drift region resistance.

The superjunction concept may be applied to Vertical DMOSTs to achieve reduced on-resistance in devices having a high breakdown voltage. Superjunction vertical double diffused MOSFET (SJ-VDMOST) provide reduced resistivity of the drift region in vertical power devices.

The first discrete commercial SJ-VDMOST device 50, illustrated in FIG. 4, was introduced by Deboy et al. and labeled CoolMOS™, which is the trademark of SIEMENS AG, of Munich, Germany. The device 50 includes a source electrode 18, a drain electrode 20, a gate electrode 22, channel regions 52, and alternatively stacked heavily doped n pillars 54 and p pillars 56 called SJ pillars 58. For a detailed description of the CoolMOS™ device, see i) G. Deboy, M. Marz, J. P. Stengel, H. Strack, J. Tihanyi and H. Weber, "A New Generation of High Voltage MOSFETs Breaks the Limits Line of Silicon", Proceedings of International Electron Devices Meeting (IEDM), pp. 683–685, 1998; and ii) L. Lorenz, G. Deboy, A. Knapp and M. Marz, "COOLMOS™—A New Milestone in High Voltage Power MOS", Proceedings of the 11th International Symposium on Power Semiconductor Devices and ICs (ISPSD), pp. 3–10, 1999; incorporated herein by reference. The CoolMOS™ structure achieves a factor of 5 reduction in the on resistance with respect to a state of the art conventional 600V VDMOST. At the same time the device demonstrates superior switching characteristics.

The CoolMOS™ structure is based on the SJ concept. For a detailed description of the theoretical background work of the SJ concept applied to semiconductor devices, see i) U.S. Pat. No. 4,754,310; ii) U.S. Pat. No. 5,216,275; iii) U.S. Pat. No. 5,438,215; and iv) X. B. Chen, P. A. Mawby, K. Board, C. A. T. Salama, "Theory of a Novel Voltage Sustaining Layer for Power Devices", Microelectronics Journal, vol. 29, pp. 1005–1011, 1998; incorporated herein by reference. The SJ concept may be explained with the aid of FIG. 5. The SJ concept is based on achieving charge compensation in the SJ drift region 60 which may be realized by replacing the low doped drift region in a VDMOST with alternatively stacked, heavily doped n pillars 54 and p pillars 56; SJ pillars 58. When a reverse bias is applied to the SJ pillars 58 (forward blocking mode), an electric field is established which depletes the SJ pillars 58 of their charge carriers moving them in opposite directions towards their respective ohmic contacts 62 and 64 as shown in FIG. 5(a). The depletion region edges spread out of the SJs 66 (the junctions between the n pillars 54 and p pillars 56) towards depletion edges extending from neighboring SJs 66.

During this initial stage of the blocking mode the electric field increases fairly rapidly. Once depletion regions from adjacent SJs 66 merge the SJ drift region 60 becomes completely depleted of charge carriers and the bound (equal but opposite) charge in the n pillars and p pillars cancel each other out causing the net charge across the SJ drift region 60 to be effectively zero. The electric field distribution is spread uniformly over the SJ drift region 60 as shown in FIG. 5(b) and the electric field distribution in the SJ drift region 60 rises slowly with the increase of the reverse bias until the critical electric filed is reached at the breakdown point, and the breakdown mechanism in a SJ drift region 60 is governed by the impact ionization process. The incremental rise of the electric field in the SJ drift region 60 as a result of the increase in the reverse bias is inversely proportional to the SJ drift region 60 length $L_D$.

The SJ structure results in: i) a flat electric field distribution in the SJ drift region 60 which yields the highest possible breakdown voltage (for a given drift region length) which is independent of the doping concentration of the SJ drift region 60 and ii) a significant improvement of the specific on-resistance achieved by using high doping concentrations in the n pillars 54. The doping of the n pillars 54 may be increased by as high as one to two order of magnitudes as compared to conventional structures thus compensating for the fact that half of the conducting area in the SJ drift region 60 is lost to the idle p pillars 56.

The main challenge in implementing SJ-VDMOST is the requirement for deep vertical SJ pillars 58, for example in 600V devices a SJ drift region 60 depth of about 35 $\mu$m is required, this significantly increases the cost and time of manufacturing since it is estimated that at least 5 to 6 successive epitaxial processes (each followed by an ion-implantation process) are needed to achieve such deep SJ pillars 58.

Another method to fabricate a 250V SJ-VDMOST utilizes tilted ion implantation at a low-incident angle along the side walls of a deep trench (with aspect ratio=20 $\mu$m/1.2 $\mu$m). For a detailed description of a tilted ion implantation technique, see T. Nitta, T. Minato, M. Yano, A. Uensis, M. Harada, and S. Hine," Experimental Results and Simulation Analysis of 250V Super Trench Power MOSFET (STM)", Proceedings of the 12th International Symposium on Power Semiconductor Devices and ICs (ISPSD), Proceedings, pp. 77–80, 1999; incorporated herein by reference. The n pillars 54 are formed by phosphorus ion implantation into one trench sidewall and the p pillars 56 are formed by boron ion implantation to the opposite sidewall as depicted in FIG. 6. The depth of the trench is limited by the minimum possible tilt angle that may be used to dope the bottom of the trench, therefore limited BV is achieved using this method. Another problem with this structure is the amount of the reflected ions due to the low incident angle is not negligible, these reflected ions are re-implanted to the opposite sidewall of the trench near the bottom causing an unintentional charge compensation and an uneven distribution of the pillars along the trench. This makes charge balance in the n and p stripes very difficult. Moreover the trench is subsequently refilled with oxide after the ion implantation process which means that the active area of the device is not fully utilized.

As in discrete SJ-VDMOST, the SJ concept may be applied to lateral power devices used in PICs where the chip area and power losses are of primary importance. For a description of lateral SJ devices, see T. Fujihira, "Theory of Semiconductor Superjunction Devices", Japan Journal of Applied Physics, Vol. 34, pp. 6254–6262, 1997; incorporated herein by reference. In lateral devices the drift region extends laterally as opposed to vertically as in the case of VDMOSTs, thus the requirement to fabricate deep pillars necessary for high voltage applications is eliminated.

Applying the SJ concept to lateral power devices faces several difficulties. In order to achieve high performance SJ-LDMOST devices several conditions must be met. The doping profiles in the n and p pillars must be high and tightly matched. Simulation results indicate that the BV is very sensitive to charge imbalance in the pillars as shown in FIG. 7, the sensitivity becoming more pronounced with the increase of doping levels in the pillars, indicating the existence of a trade off between the specific on-resistance and breakdown voltage sensitivity to charge imbalance. While in SJ-VDMOST this problem may be dealt with by developing a tightly controlled fabrication process. In lateral devices, in addition to the requirement of tightly matched profiles in the pillars, the design of SJ devices must account for the charge imbalance caused by the substrate-assisted-depletion which is an undesirable interaction between the SJ drift region and the finite resistivity substrate on which the device is built. For a detailed description of the substrate assisted depletion problems, see S. G. Nassif-Khalil, "Superjunction Lateral Devices for Power Integrated Circuits", Ph.D Thesis Proposal, University of Toronto, 2000; incorporated herein by reference.

PICs are mainly implemented in silicon technology that uses either bulk or SOI substrates, in both cases the fact that the SJ drift region is terminated at the bottom by a silicon substrate results in a significant reduction of the breakdown voltage due to the existence of a vertical electric field component which gives a rise to a surplus of one type of charge in the pillars when a reverse bias is applied to the structure. This surplus increases monotonically towards the drain contact region and upsets the delicate charge balance between the n and p pillars.

The mechanisms by which the problematic surplus of charge is generated in the case of a bulk substrate and the case of an SOI substrate are different. In the implementation of an SJ-LDMOST device 68 on bulk substrates 70, shown in FIG. 8, pn junctions 72 are formed between the n pillars 54 and p– type substrate 70, the pn junctions 72 in this case are horizontal while the SJs 66 are vertical. The horizontal junctions assist in depleting the n pillars 54 from the bottom, the extent of the depletion is not uniform and depends on the lateral position because there is a voltage gradient across the drift region. In other words, the region closer to the drain contact region 74 will be depleted more than regions away from the drain contact region 74, such as the regions which are in the immediate vicinity of the source electrode 18 and the gate electrode 22, as demonstrated in FIG. 9, which shows an equipotential contour plot of an SJ-LDMOST device 68.

In a similar fashion lateral SJ structures fabricated on an SOI substrate suffer from charge imbalance along the drift region, however, the induced charges are due to a field effect action generated by the capacitive structure consisting of the Silicon-BOX-Silicon sandwich with the top silicon epitaxial layer 46 acting as the top capacitance plate, the buried oxide layer 42 as the capacitance dielectric and the lower silicon substrate layer 44 as the capacitance bottom plate as indicated in FIG. 10, wherein the downwards arow depicts the direction of the problematic field effect action. For a detailed description of lateral structures fabricated on an SOI substrate, see Y. S. Huang and B. J. Baliga, "Extension of RESURF Principle to Dielectrically Isolated Power Devices", International Symposium on Power Semiconductor Devices & ICs (ISPSD). Proceedings, pp. 27–30, 1991; incorporated herein by reference. The amount of charge induced at the capacitance plates depends on the voltage across the capacitance and therefore varies across the SJ drift region 60 resulting in a charge surplus in one of the SJ pillars 54 or 56. This charge surplus increases monotonically towards the drain contact region 74.

It would therefore be desirable to eliminate the substrate-assisted-depletion effect in a SJ-LDMOST. A substrate must be provided which provides the necessary dielectric isolation for both low voltage and high voltage devices in a PIC, acts as mechanical support, and provides an effective thermal conductive path to minimize self-heating effects. It would therefore be desirable to implement a device structure which proposes a practical and a simple solution to these problems allowing the implementation of the SJ concept in lateral semiconductor devices.

SUMMARY OF THE INVENTION

The present invention provides a SJ-LDMOST device which significantly improves the on-state, off-state, and switching characteristics of lateral power devices for power integrated circuits applications. The device is fabricated on an insulator substrate. The device structure effectively solves the main problem encountered when applying the superjunction concept to lateral power devices, that is, the charge imbalance between the n and p SJ pillars which develops under reverse bias due to substrate-assisted-depletion which in turn results in a substantial reduction of the breakdown voltage BV in SJ lateral devices implemented in a finite resistivity substrate e.g. bulk or SOI. The device structure achieves charge compensation in the drift region by terminating the bottom of the SJ structure by a dielectric hence eliminating the undesirable vertical electric field component and preventing any substrate-assisted-depletion. The device structural arrangement thereby achieve a uniform distribution of the electric field thus maximizing the BV for a given drift region length. Due to the uniform electrical field distribution over the entire drift region, the BV increases rnonotonically with increasing drift region length $L_D$ and does not exhibit any saturation with the increase of $L_D$ as is the case in lateral SOI devices which are inhibited by the BOX thickness. Due to the relative ease by which the narrow SJ pillar deplete, the effective doping concentration in the drift region may be increased by a factor of 5 resulting in a significant improvement of the specific on-resistance over conventional lateral power devices.

In a preferred embodiment, the apparatus includes a lateral semiconductor device composed of an insulating substrate, a semiconductive layer formed on the insulating substrate, and a lateral power integrated circuit device formed in the semiconductive layer, having a superjunction drift region formed with a plurality of alternating heavily doped n pillars and p pillars.

Other advantages and features of the invention will become apparent from the following detailed description of the preferred embodiments and the accompanying drawings.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS OF THE INVENTION

In related art RESURF LDMOST devices implemented in SOI substrate, the existence of bottom silicon layer is essential since it acts as a back gate and results in depleting the drift region vertically which is requited to achieve the RESURF condition (two perpendicular depletion edges merge and reinforce each other), however, in SJ lateral devices this bottom silicon layer does not serve any useful function (other than providing a mechanical support), on the contrary, it causes charge imbalance.

For ideal SJ operation, the charge in the n and p pillars should be mirror image of each other under reverse bias and this symmetry should be maintained as the reverse bias increases. This requires that when the structure is under reverse bias the n-pillar is depleted by the two neighboring p-pillars only and similarly the p-pillar is depleted by the two neighboring n-pillars only with the depletion edges spreads outward and lies in a plane parallel to the physical SJs planes as in the case of SJ-VDMOST.

To achieve the ideal SJ operation, the substrate-assisted-depletion effect must be eliminated. This means that the entire LDMOST including the SJ drift region must be terminated at the bottom by a perfect insulator. The insulator under the SJ drift region must not participate in the SJ depletion action.

A choice for a suitable substrate must be made to meet the above requirements and in addition to providing the necessary dielectric isolation for both low voltage and high voltage devices in a PIC, the substrate must act as mechanical support and provide an effective thermal conductive path to minimize self-heating effects.

Figure 1:
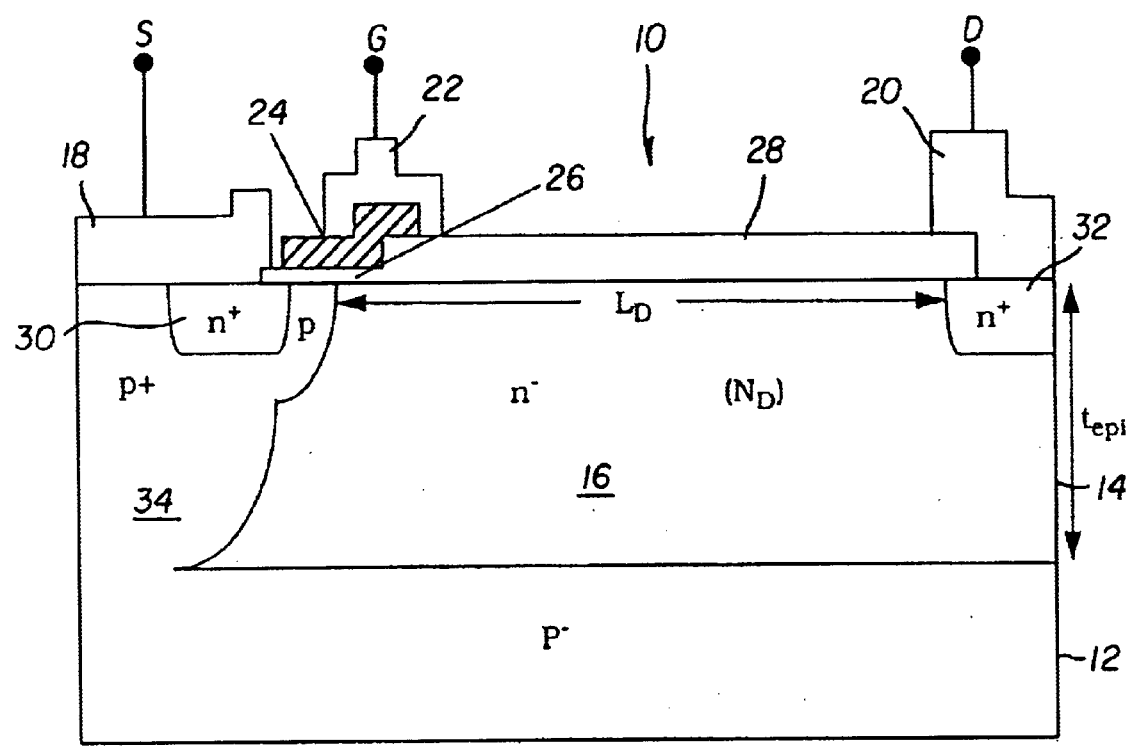
FIG. 1 is a cross-section of a RESURF LDMOST.
Figure 2:
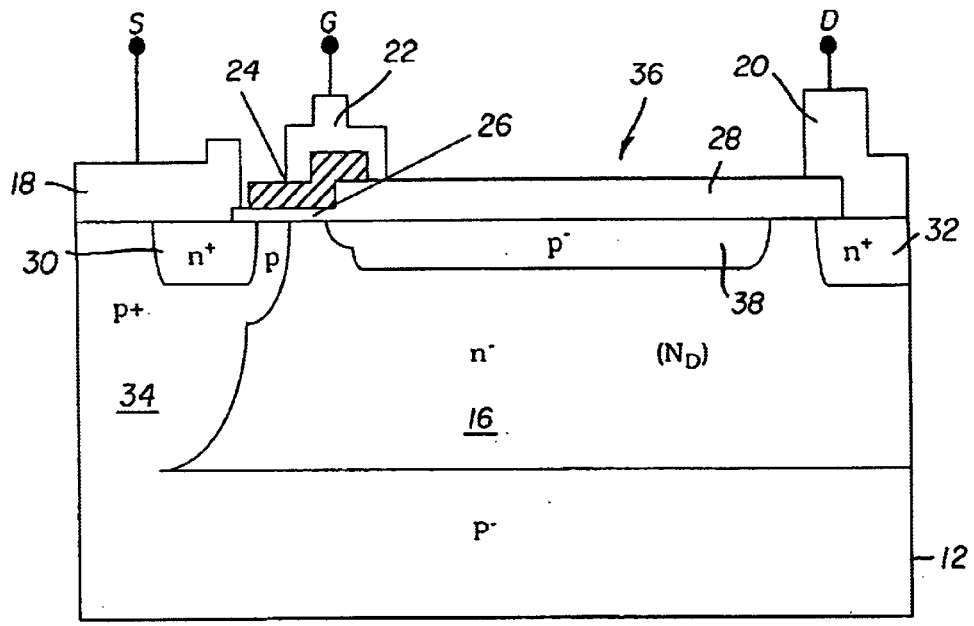
FIG. 2 is a cross-section of a double RESURF LDMOST.
Figure 3:
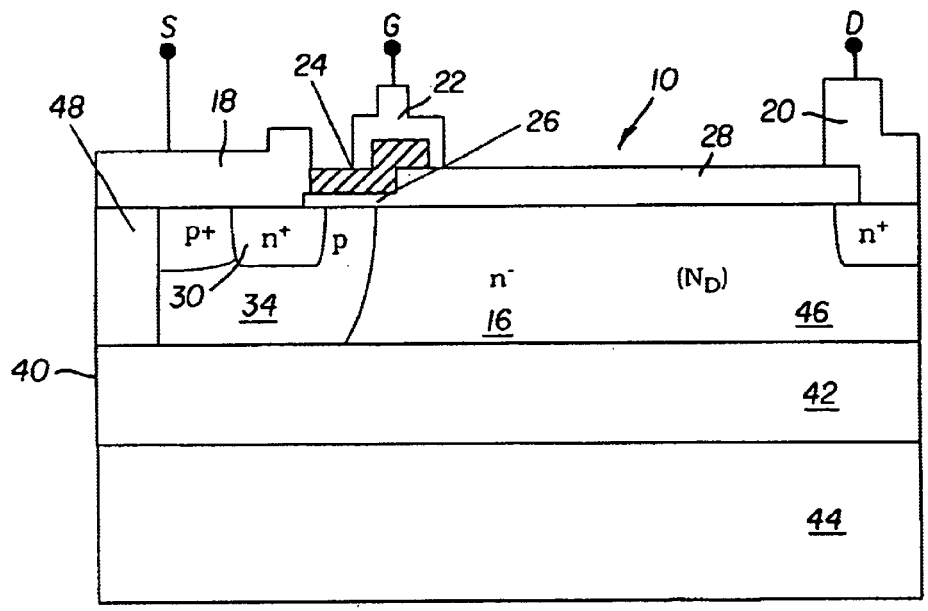
FIG. 3 is a cross-section of a RESURF LDMOST on an SOI substrate.
Figure 4:
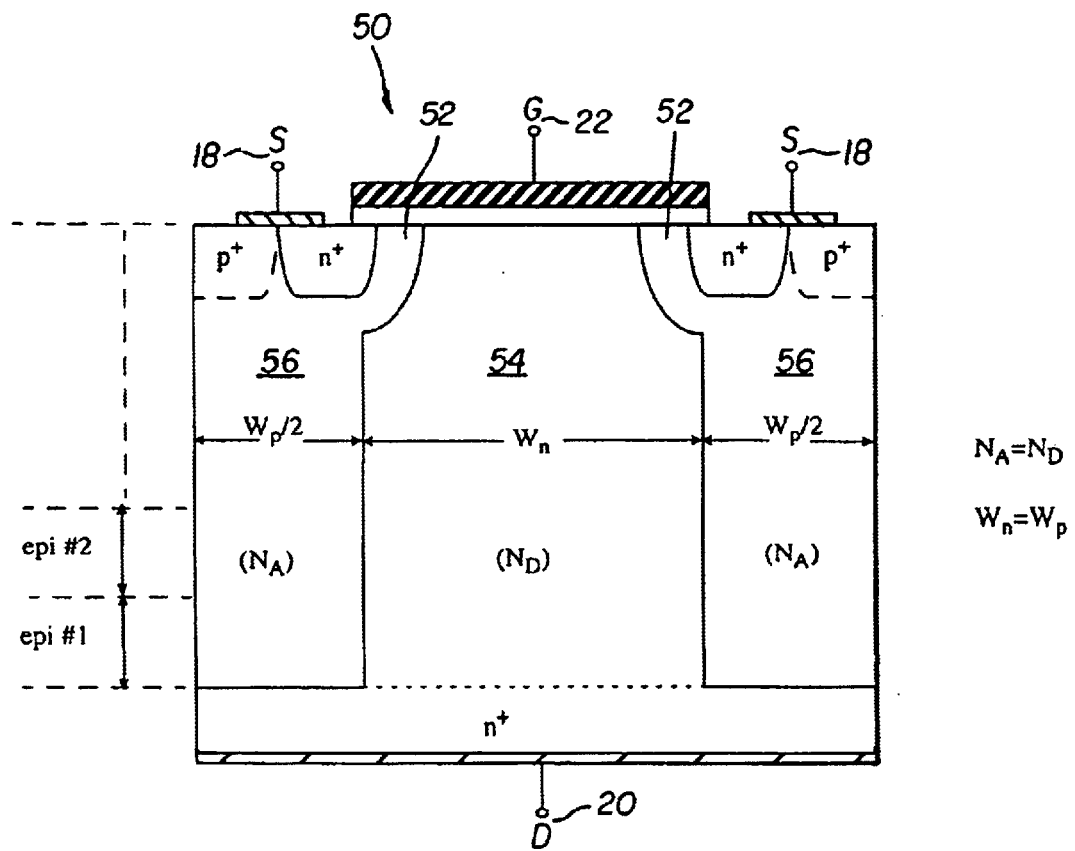
FIG. 4 is a cross-section of a CoolMOS™.
Figure 5:
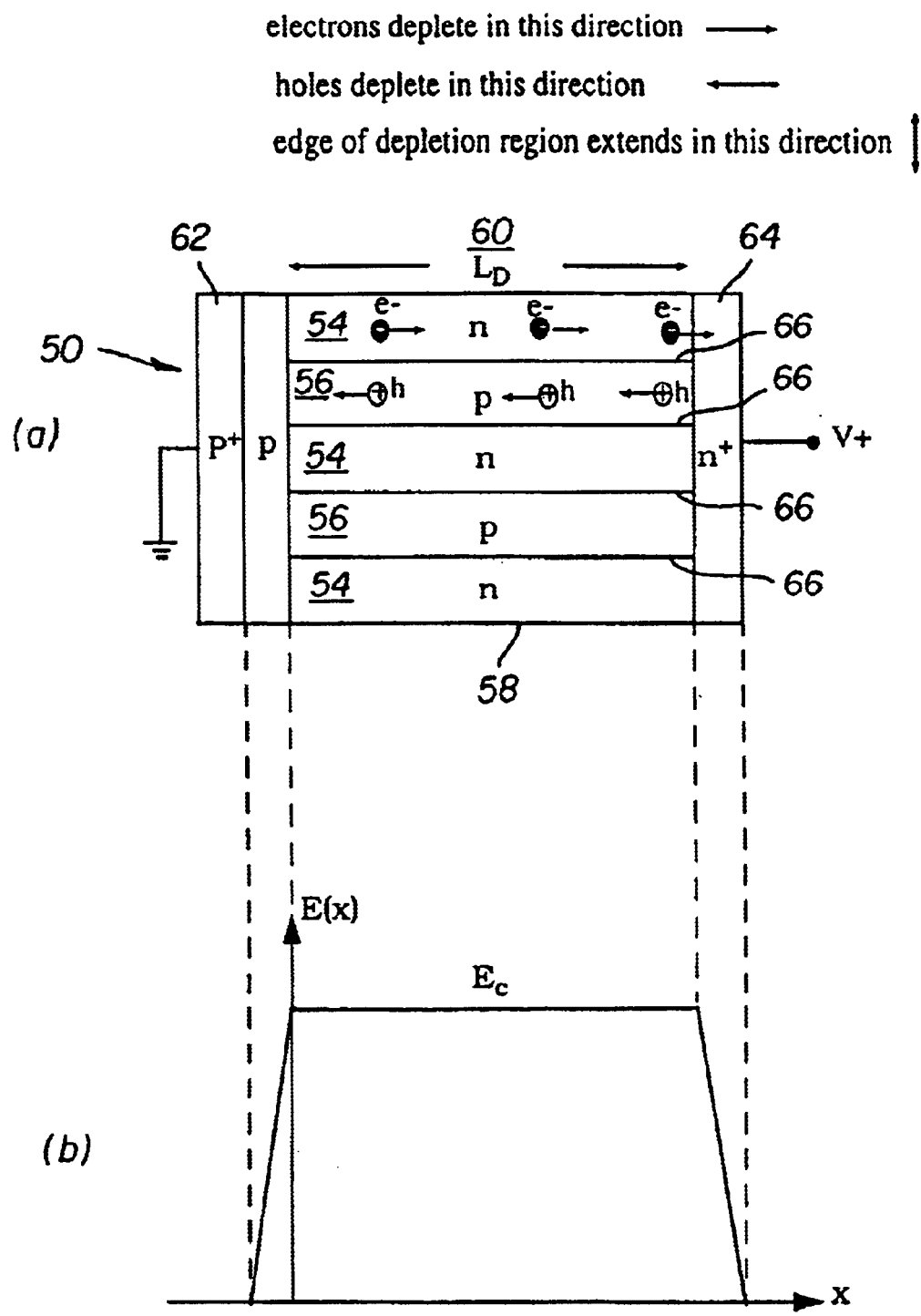
FIG. 5 is a cross of an SJ drift region in a VDMOST.
Figure 6:
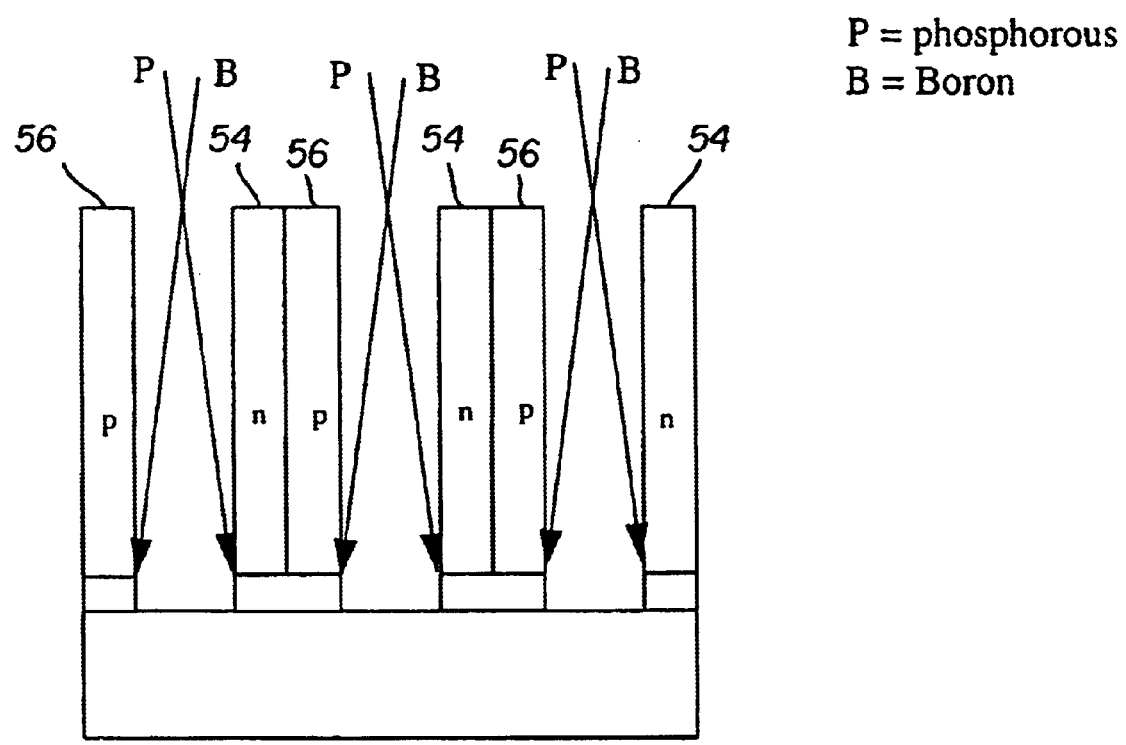
FIG. 6 is a side view of a tilted ion implantation process into the sidewall of deep trenches.
Figure 7:
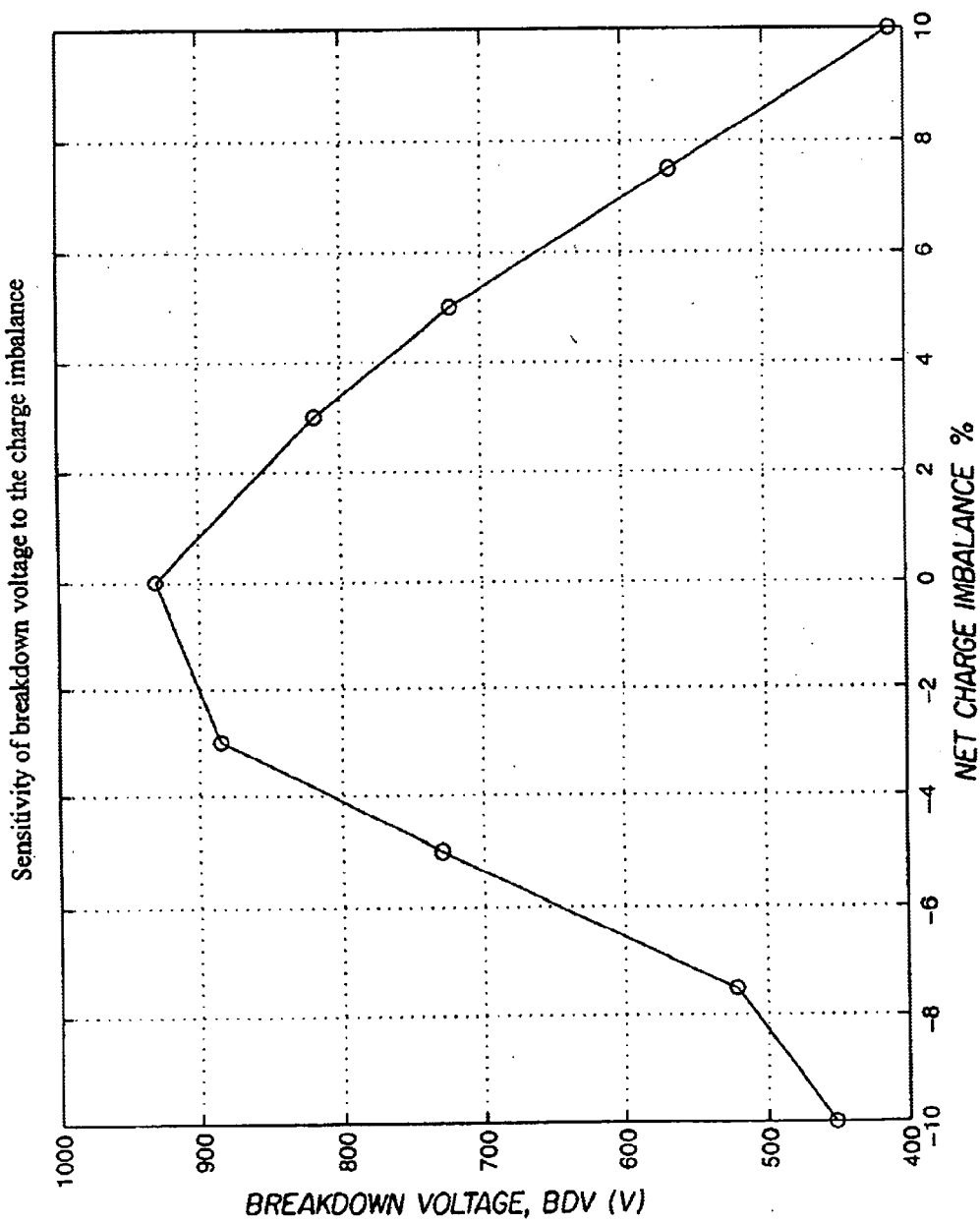
FIG. 7 is a graph of breakdown voltage as a function of charge imbalance.
Figure 8:
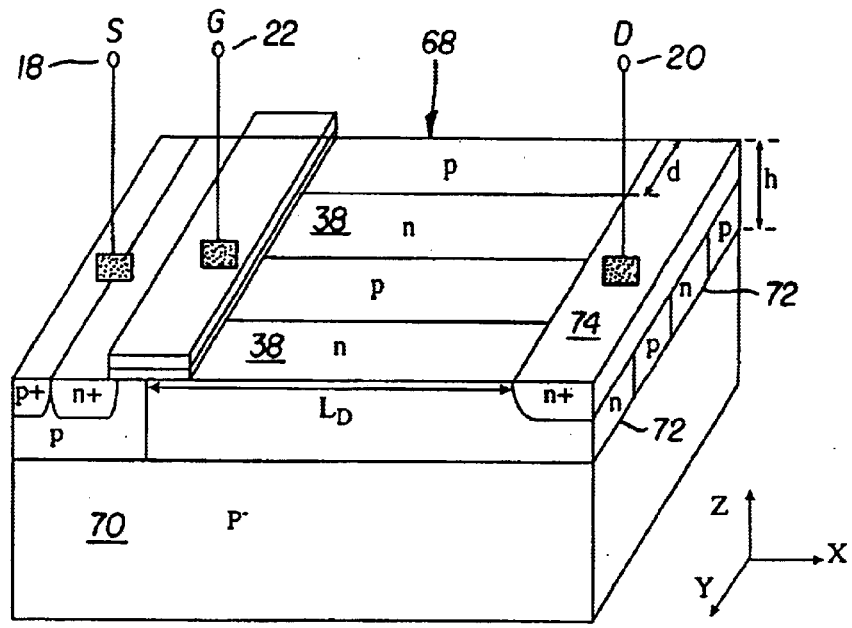
FIG. 8 is a three dimensional view of an SJ-LDMOST on a bulk substrate.
Figure 9:
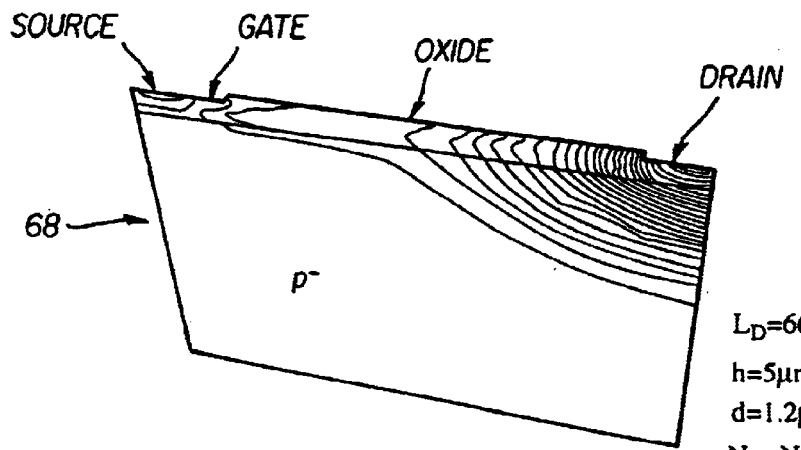
FIG. 9 is graph of equipotential contours for an SJ-LDMOST on a bulk substrate at the breakdown point where $V_{GS}$=0V and $V_{DS}$=290 V, which indicates the existence of a vertical electric field.
Figure 10:
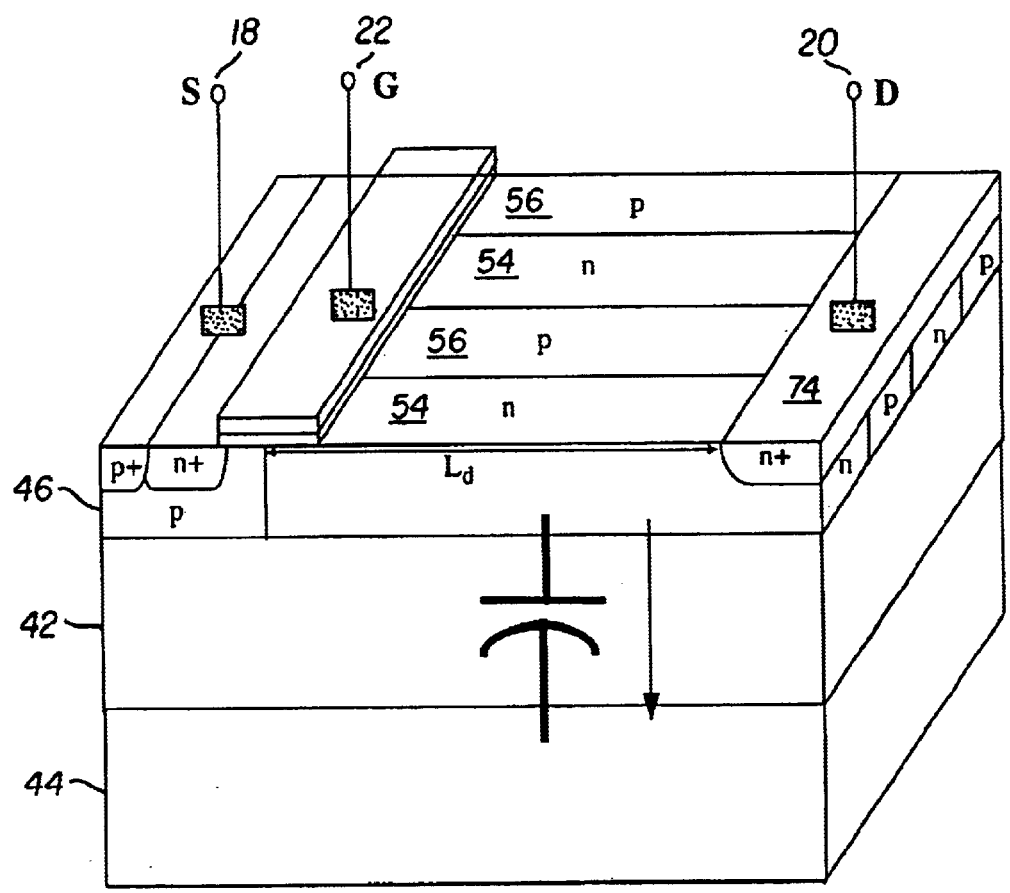
FIG. 10 is a three dimensional view of an SJ-LDMOST on an SOI substrate.
Figure 11:
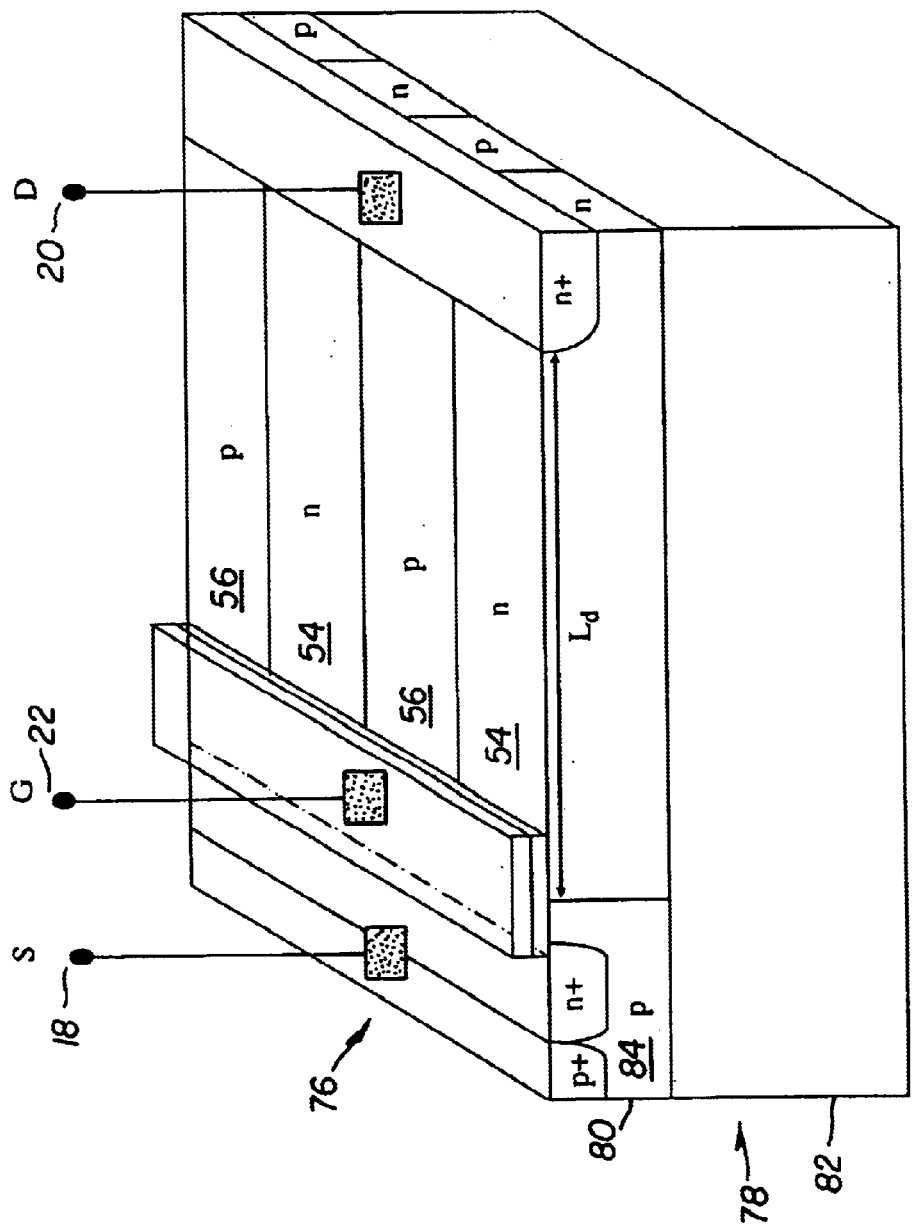
FIG. 11 is a three dimensional view of an SJ-LDMOST on a bulk silicon substrate.

The practical solutions to the substrate-assisted-depletion according to this invention is either to use a dielectric substrate such as sapphire or to use a conventional SOI substrate as the starting material and to selectively remove the bottom silicon layer from regions where the SJ-LDMOSTs reside. In either case the SJ drift regions in LDMOST are terminated at the bottom by a layer of a perfect insulator to ensure proper SJ operation. The SJ-LDMOST device 76 structure in accordance with a preferred embodiment of the present invention is shown in FIG. 11. The device 76 includes a source electrode 18, a drain electrode 20, a gate electrode 22, n pillars 54, p pillars 56, a p-well 84, and the device 76 is formed on an insulating substrate 78. The insulating substrate 78 preferably includes a semiconductor layer 80 and a dielectric layer 82.

The materials for the semiconductor layer 80 and the dielectric layer 82 of the insulating substrate 78 are preferably silicon on sapphire, single crystal silicon on quartz, polycrystalline silicon on quartz substrates, and single crystal silicon or polycrystalline silicon on SOI substrate with selectively etched bottom silicon regions. However, any other suitable material may be utilized.

The concept of the present invention may be applied to many types of SJ lateral power devices (including MOSFETs, diodes . . . etc.) implemented on single or polycrystalline silicon films on perfect insulators (including selectively etched bottom silicon layer SOI wafers).

Figure 12:
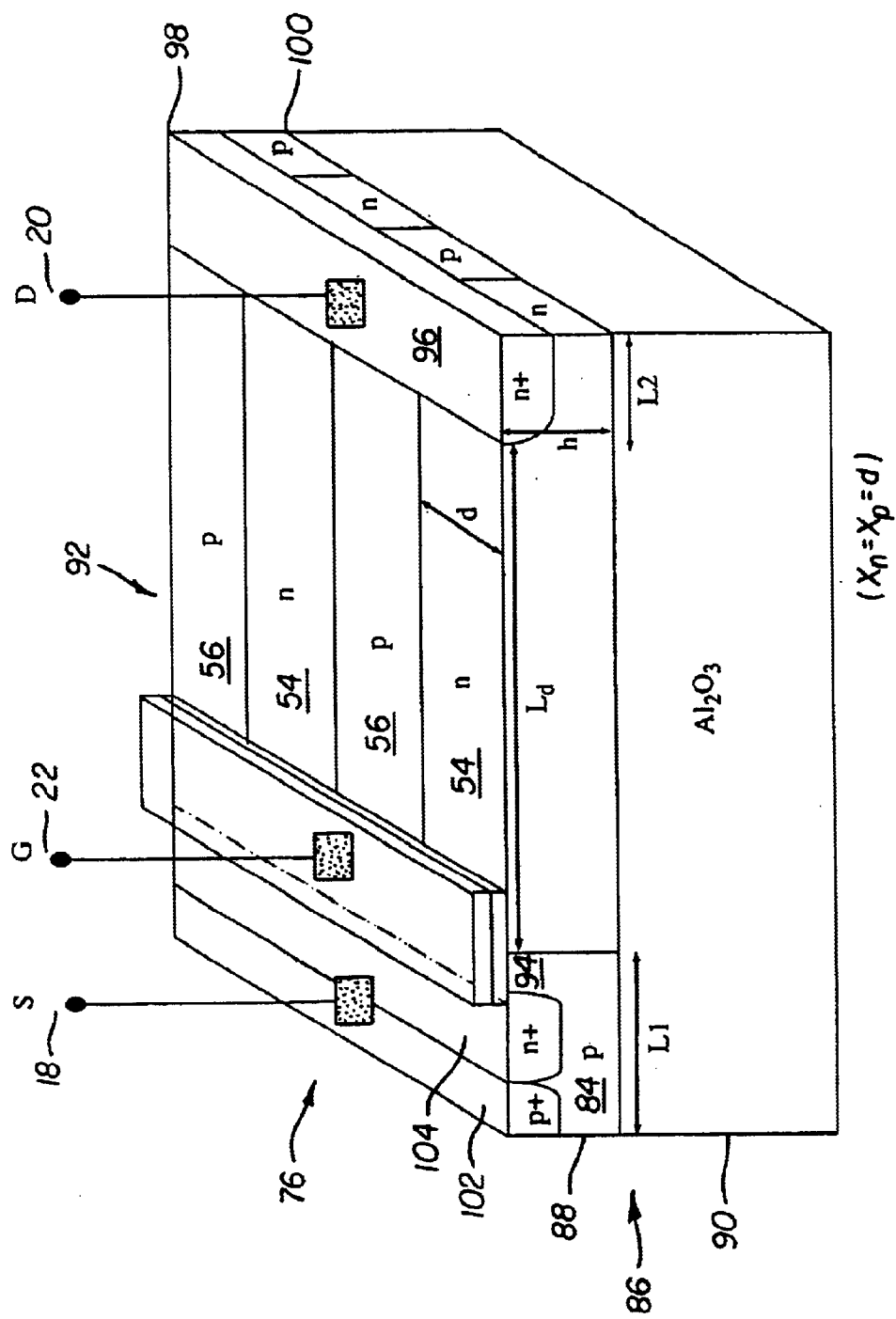
FIG. 12 is a three dimensional view of an SJ-LDMOST on an SOS substrate, where $X_n$=$X_p$=d.

In accordance with the first embodiment of the invention, a SJ-LDMOST is formed on a silicon-on-sapphire (SOS) substrate. A preferred embodiment of the SJ-LDMOST device 76 structure, utilizing an SOS substrate 86 is shown in FIG. 12. The device 76 is fabricated on a single crystal silicon film 88 having a crystallographic orientation of (100) which is grown epitaxially on a sapphire wafer 90 with a crystallographic orientation of (1102) (known as $\propto Al_2O_3$). The SJ drift region 92 consists of alternating n pillars 54 and p pillars 56 extending laterally from the edge of the channel region 94 to the n+ drain contact 96 and vertically from the silicon surface 98 down to the Si/Sapphire interface 100. The p pillar 56 is connected to a p+ contact 102 through the p-well 84 by intentionally avoiding the n+ source region 104 impurities from diffusing downward to the Si/sapphire interface 100 and therefore allowing a path for the holes to deplete during turn-off or to be supplied during turn-on from the p+ contact 102. The integrated doping in the n pillars 54 and p pillars 56 are matched to achieve charge compensation during the blocking mode of operation.

The pillars doping and physical dimensions are determined by a set of design criteria and the fabrication technology used in the implementation of the device 76. The following section discusses a set of design criteria necessary for the proper operation of SJ-LDMOST on insulator substrates.

The condition for charge compensation, assuming uniform doping profile in the pillars is given by equation 1, as follows:

$$q \cdot N_D \cdot X_n = q \cdot N_A \cdot X_p \qquad (EQ\ 1)$$

where q is the elementary charge and $N_D$, $X_n$, $N_A$, and $X_p$ are the net impurity doping concentration and pillar width of the n-pillar and p-pillar respectively.

For proper operation of the SJ the depletion region edges of adjacent pillars must merge before the maximum electric field at the physical superjunction reaches the critical electric field, quantitatively this condition may be expressed by equation 2, as follows:

$$\frac{q \cdot N_D \cdot X_n}{2\varepsilon_s} = \frac{q \cdot N_A \cdot X_p}{2\varepsilon_s} < E_c \qquad (EQ\ 2)$$

where $E_c$ is the critical electric field of silicon and $\in_s$ is the silicon permittivity The breakdown voltage of the device is determined by the drift region length assuming flat electrical field profile according to equation 3, as follows:

$$BV = E_c \cdot L_D \qquad (EQ\ 3)$$

where BV is the breakdown voltage of the device and $L_D$ is the drift region length.

The device specific on-resistance may be calculated using equation 4, as follows:

$$R_{on,sp} = \frac{d^2 \cdot L_D}{\mu_n \cdot (d - w_{dep}) \cdot h \cdot \varepsilon_s \cdot E_c^2} \cdot BV \qquad (EQ\ 4)$$

where d is pillar width, $\mu_n$ is the electron mobility, $w_{dep}$ is the depletion width at zero bias and, h is the pillar height.

$w_{dep}$ is given by equation 5, as follows:

$$W_{dep} = \sqrt{\frac{2 \cdot \varepsilon_s}{q} \cdot \left[\frac{1}{N_A} + \frac{1}{N_D}\right] \cdot V_0} \qquad (EQ\ 5)$$

where $V_o$ is the built-in potential of the SJ at zero bias and is given by equation 6 as follows:

$$V_0 = \frac{kT}{q} \cdot \ln\left[\frac{N_A \cdot N_D}{n_i^2}\right] \qquad (EQ\ 6)$$

where k is Boltzmann's constant, T is the operating temperature in °K., and $n_i$ is the intrinsic concentration of silicon at the operating temperature.

Equation 4 describes the relationship between the specific on-resistance and BV, it also shows that in order to achieve low specific on-resistance for a given BV, the aspect ratio of the pillars h/d should be maximized. If the pillar width d is kept constant and the pillar height h is made as high as possible the current path area is maximized while the BV remains unchanged. This is quite different from the RESURF LDMOST where the drift region (epitaxial layer) thickness must be arbitrarily thin in order to deplete the drift region vertically setting an upper limit to the current conduction path area for a given doping concentration.

Device simulations using the 3D device simulator DESSIS-ISE software by ISE Integrated Systems Engineering AG were carried out to estimate the electrical characteristics of the SJ-LDMOST.

Figure 13:
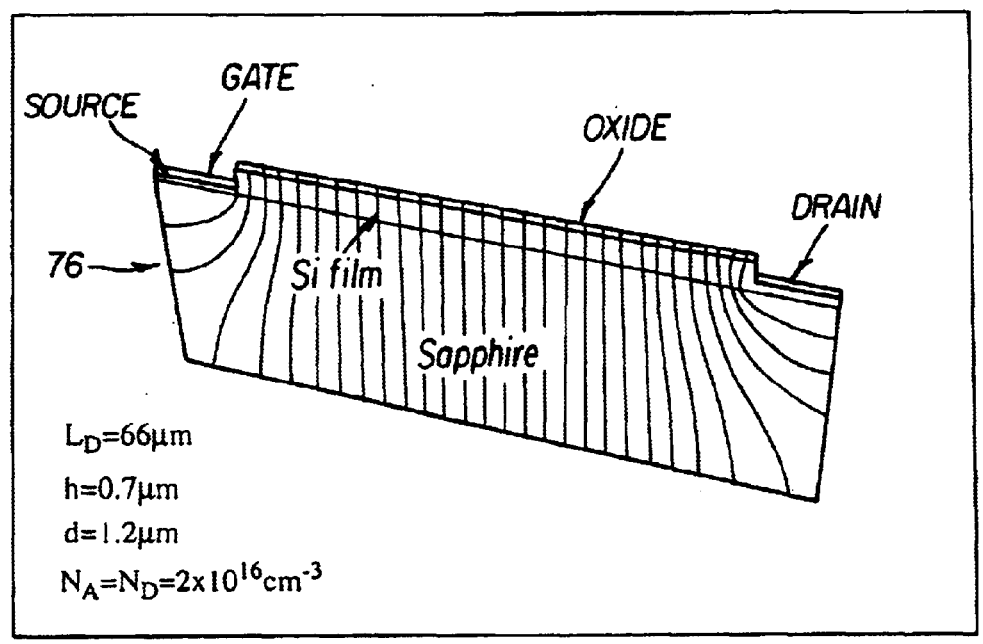
FIG. 13 is a plot of equipotential contours of an SJ-LDMOST at the breakdown point where $V_{GS}$=0 V, $V_{DS}$= 918 V.

The device BV is determined by evaluating the voltage at which the impact ionization process attains an infinite rate which is equivalent to setting the ionization integral to unity in the simulator. The equipotential contour plots for a cross section of the SJ-LDMOST device 76 are shown in FIG. 13 at the breakdown point of 918 V for a device with drift region length $L_D$=66 μm, pillar width d=1.2 μm, pillar heights h=0.7 μm and pillar doping concentration of $2 \times 10^{16}$ cm$^{-3}$ which demonstrate the uniform electric field distribution and the absence of the vertical electric field component.

Figure 14:
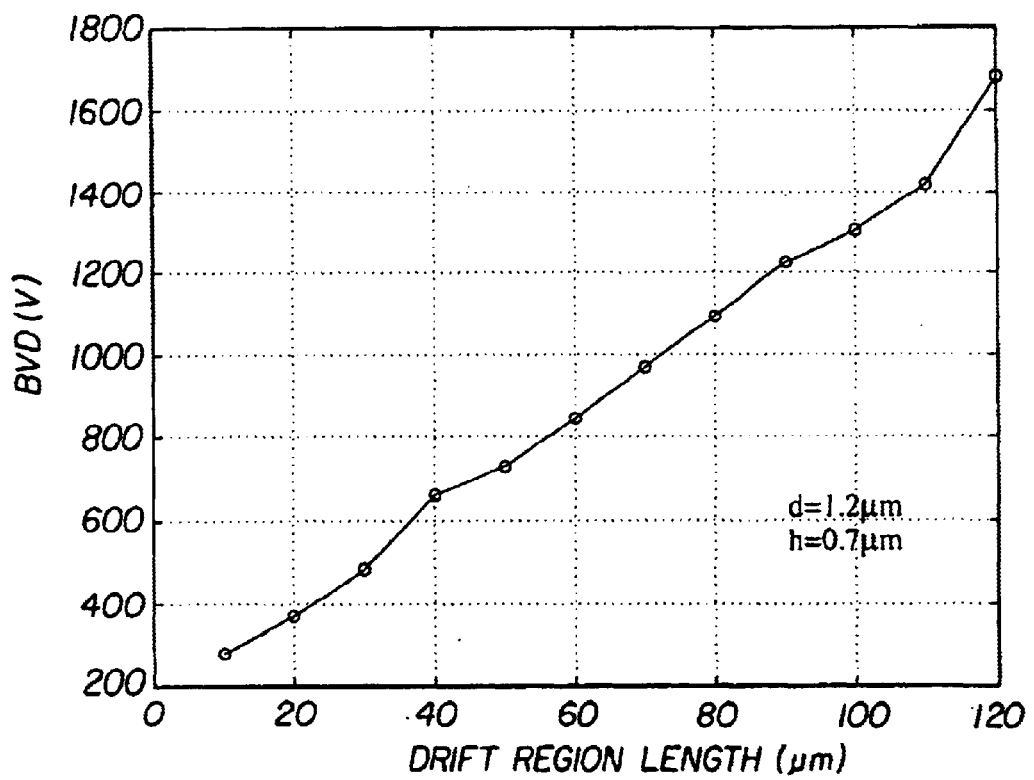
FIG. 14 is a graph of BV as a function of drift region length $L_D$ for an SJ-LDMOST.

Simulations results confirm the linear dependence of the BV on the drift region length $L_D$ and is consistent with equation 3 as demonstrated in FIG. 14 where the slope of the almost linear curve corresponds. to the critical electric field $E_c$. The curve also shows that the BV does not saturate with increasing $L_D$ as is the case in lateral SOI devices which are inhibited by BOX thickness.

Figure 15:
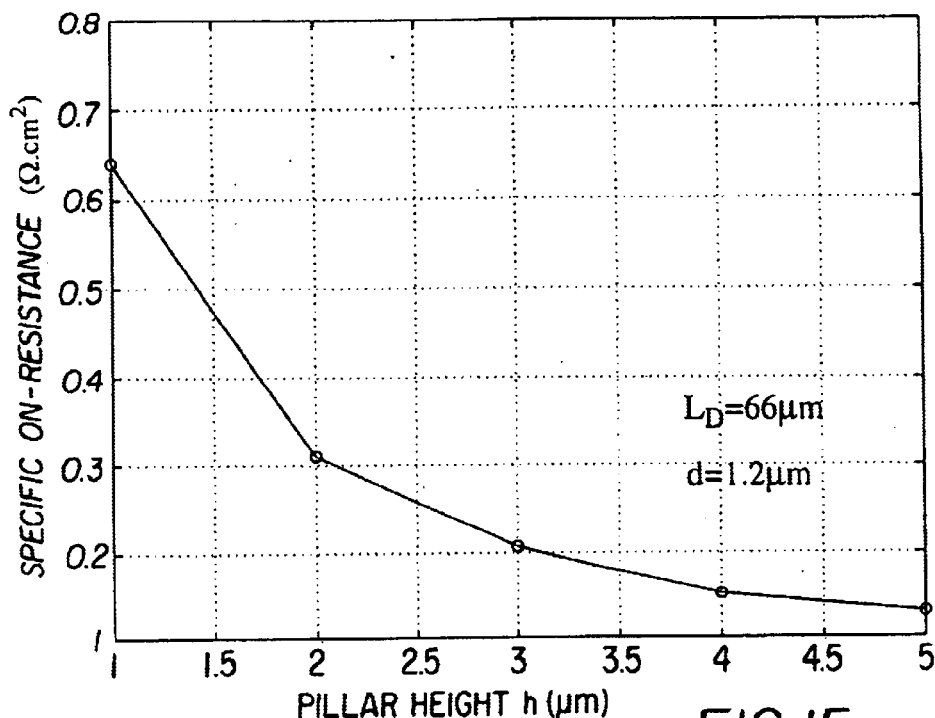
FIG. 15 is a graph of specific on-resistance as a function of pillar height, h, for an SJ-LDMOST.
Figure 16:
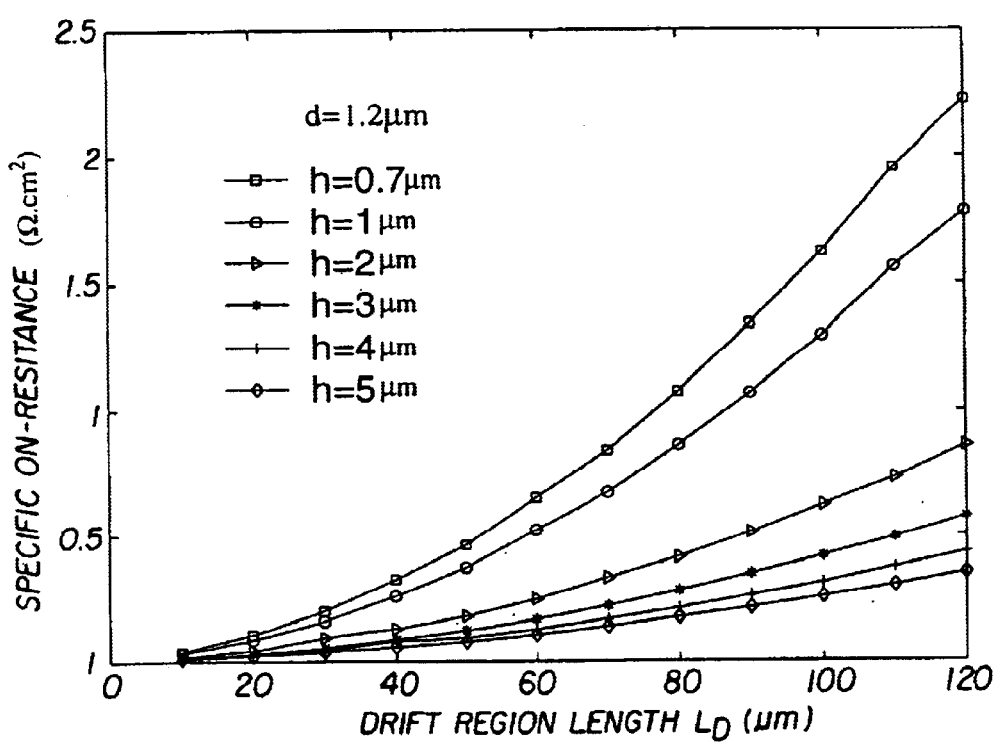
FIG. 16 is a graph of specific on-resistance vs. drift region length for several pillar heights.

Another advantage of the SJ-LDMOST is that a significant improvement of the specific on-resistance may be achieved by increasing the pillar height as shown in FIGS. 15–16 which is attributed to the increase of the current path area and is in contrast with lateral RESURF device where the epitaxial layer thickness (for a given $N_{epi}$) cannot be increased above an optimum value given by the RESURF condition ($t_{epi} \times N_{epi} < 1 \sim 2 \times 10^{12}$ cm$^{-2}$).

Figure 17:
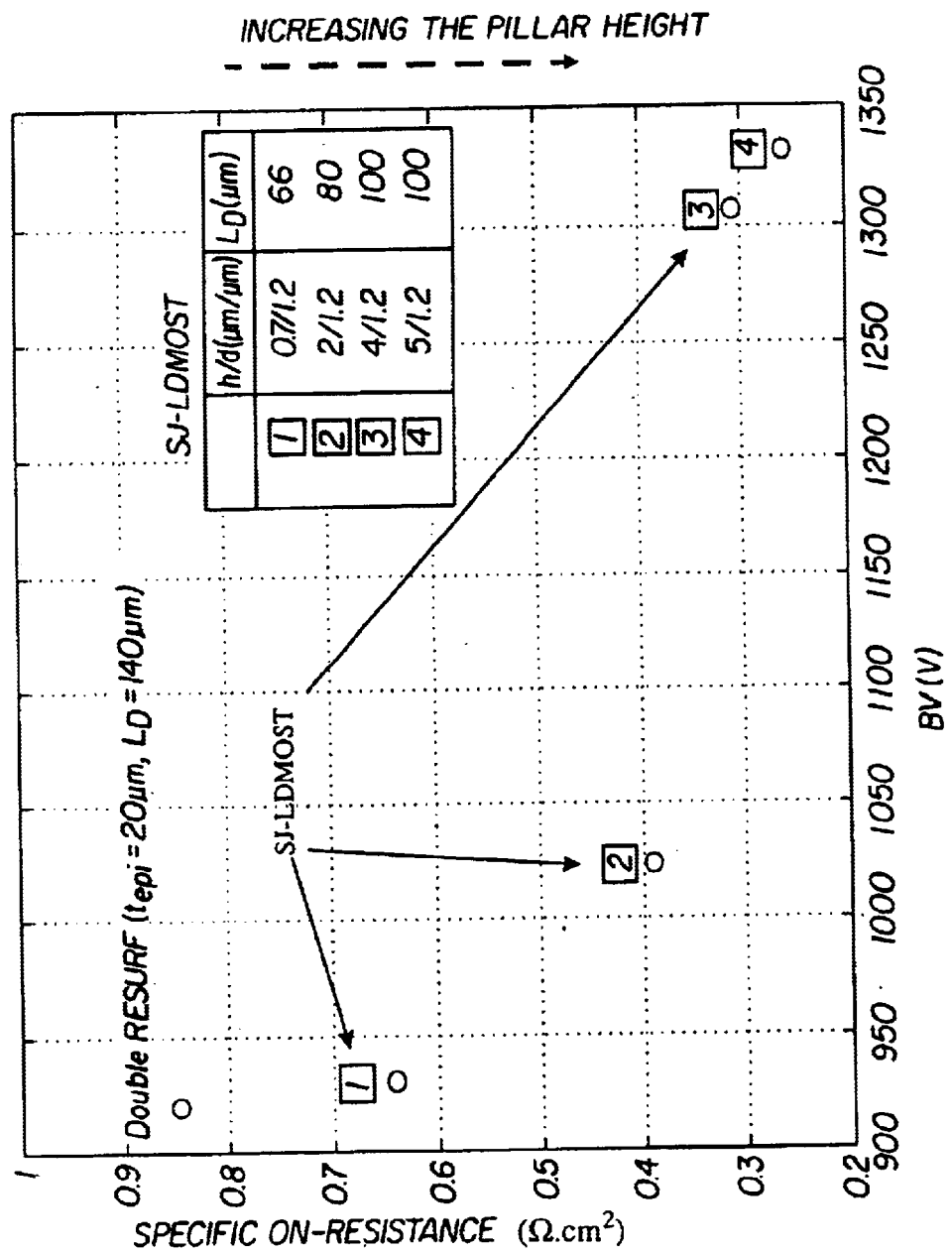
FIG. 17 is a graph of specific resistance vs. breakdown voltage which illustrates a comparison between an SJ-LDMOST and a double RESURF LDMOST.

A comparison of the performance of SJ-LDMOST of the present invention (with various $L_D$ and h) and the related art Double-RESURF LDMOST is shown in FIG. 17 and clearly demonstrates the potential of the SJ-LDMOST especially at larger pillar heights.

Figure 18:
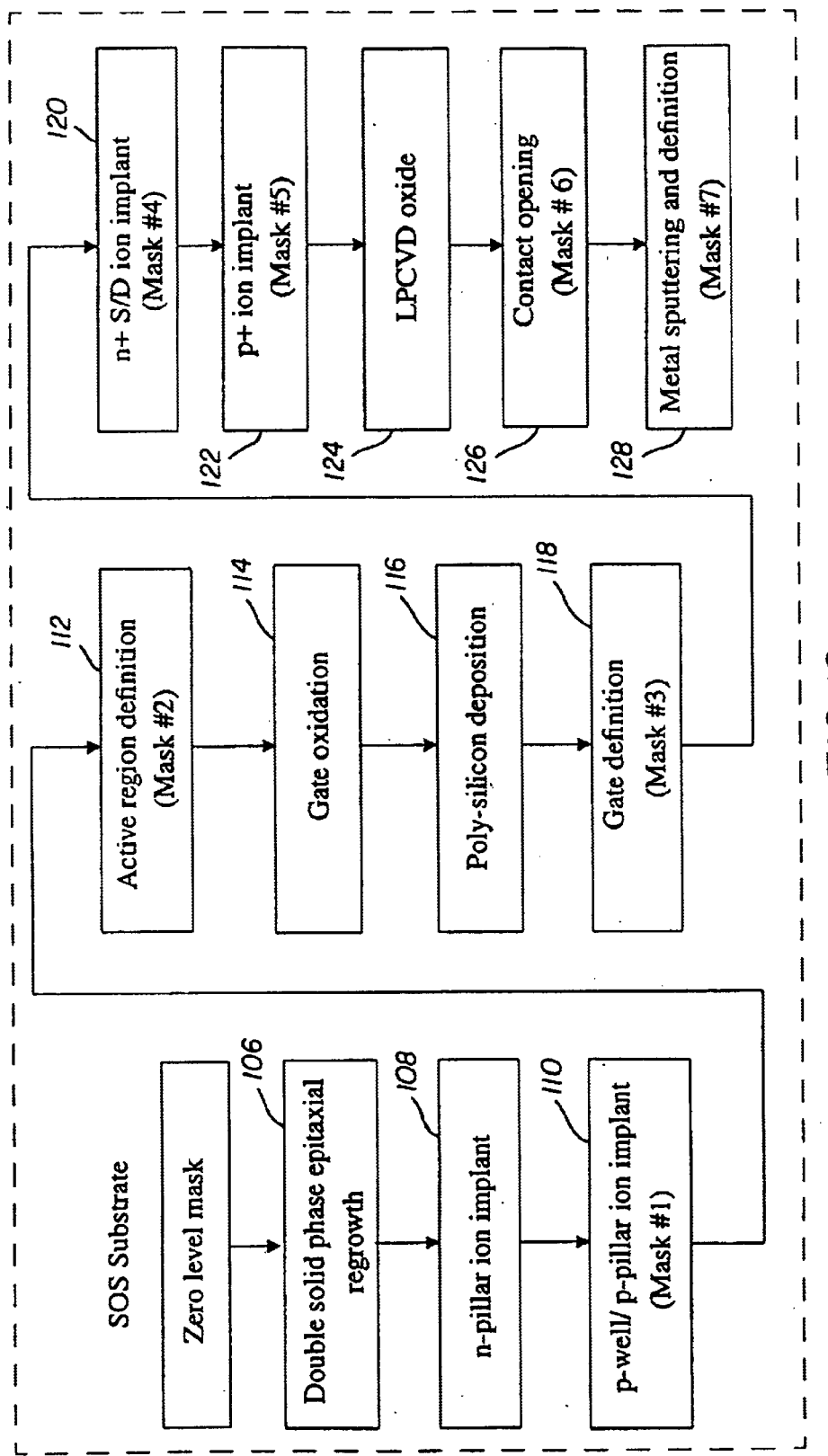
FIG. 18 is a flowchart of a manufacturing process for an SJ-LDMOST.

Using an SOS substrate as the starting material, the SJ-LDMOST device of the first embodiment may be manufactured using a seven mask CMOS compatible process. The process flow summary is outlined in FIG. 18. The process starts with a double solid phase epitaxial regrowth process 106 to remove twinning defects at the Si/Sapphire interface and achieve bulk mobility. The n pillar ion implantation doping 108 and p pillar ion implantation doping 110 are carried out using multiple high energy ion implantations to achieve sharp vertical SJ pillars. No special masks are required since the n and p pillars are implemented using, respectively, the n-well and p-well ion implantation processes in a standard twin-well CMOS process. Implementation of the SJ-LDMOST is presently being carried out to verify the device electrical characteristics. Following the n pillar ion implant, the first mask is used to define the p-well 84 and p pillars 56 by ion implantation Next, a second mask is provided for active region definition 112. This step is followed by forming a gate oxidation layer 114, and then poly-silicon deposition 116. A third mask is utilized for gate definition 118, and a fourth mask is utilized for n+ S/D ion implantation 120. Next, a fifth mask is utilized for p+ ion implantation 122, which is followed by forming an LPCVD oxide 124. Finally, a sixth mask is utilized to make contact openings 126, metal is sputtered, and a seventh mask is utilized for metal definition 128.

Figure 19:
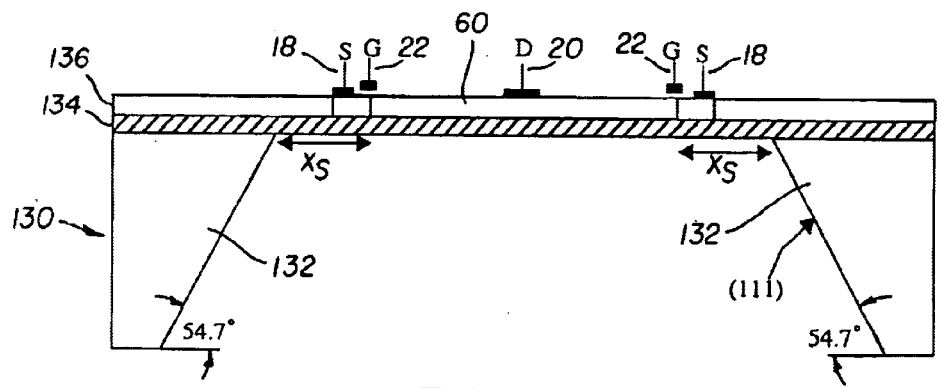
FIG. 19 is a cross-section of an SJ-LDMOST on an SOI substrate, where the handling wafer has a crystallographic orientation of (100)

In accordance with the second embodiment of the invention, an SJ-LDMOST is formed on an SOI substrate A cross section of the SJ-LDMOST device 76 is shown in FIG. 19. The device achieves charge compensation and eliminates the substrate-assisted-depletion effect in SJ-LDMOST in an SOI substrate. The SOI substrate 130 preferably includes a bottom silicon layer (handling wafer 132), a BOX layer 134, and an upper layer 136. The upper layer 136 is preferably a film of epitaxial silicon, having a crystallographic orientation of (100), and the handling wafer 132 has a crystallographic orientation of (100).

Instead of forming the SJ-LDMOST on a sapphire substrate to eliminate the vertical electric field component, in the second embodiment the SJ-LDMOST device 76 is formed on an SOI substrate 130 to achieve the same result by selectively removing the bottom silicon layer of the SOI substrate (the handling wafer 132) in specific areas of the substrate where SJ -LDMOSTs reside while using the remainder of the handling wafer 132 to provide the essential mechanical support and thermal conductive path.

Removing the bottom silicon layer in regions where SJ-LDMOSTs reside disrupts the undesirable silicon-BOX-silicon capacitive structure responsible for the vertical field effect action. Thus, the process of inducing charge and mirror charge at the plates of this capacitive structure is prevented resulting in charge compensation in the SJ pillars in the reverse bias mode and a uniform electric field distribution in the drift region.

Figure 20:
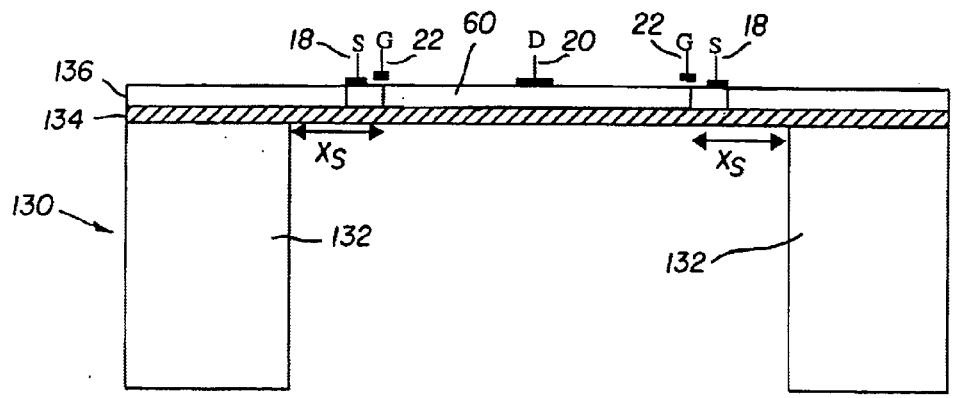
FIG. 20 is a cross-section of an SJ-LDMOST on an SOI substrate, where the Si film has a crystallographic orientation of (100) the handling wafer has a crystallographic orientation of (110).

The fabrication process of the second embodiment is comparable with CMOS process of the first embodiment with one additional step at the end of the fabrication process to remove the bottom silicon layer of the handling wafer by first patterning the regions under the SJ-LDMOSTs and a subsequent wet etching process using TMAH solution. A cross section of the second embodiment SJ-LDMOST is shown in FIGS. 19–20. The etching progresses faster in the (100) handling wafer 132 direction resulting in a 54.7° angle of the etched silicon as indicated in FIG. 19. In another preferred embodiment, a handling wafer 132 having a crystallographic orientation of (110) may be used to achieve vertical etched walls as shown in FIG. 20. Alternatively, any other suitable combination of crystallographic orientations for the handling wafer 132 and the upper layer 136 may be utilized. In the SJ-LDMOST in SOI the lateral separation $X_s$ between the end of the SJ-drift region and the edge of etched oxide at the bottom Si/SiO$_2$ interface is an important dimension for proper operation of the device. The operation of the SJ-LDMOST in SOI is similar to the SJ-LDMOST in SOS substrate and therefore to a first order approximation simulation results of the BV and the specific on-resistance are the same in both cases. An approximation is utilized because device characteristics may differ due to self heating effects on various device parameters.

The SJ-LDMOST on insulator substrate is suitable for a wide variety of PIC applications with BV requirements extending from 30V to above 1200V, such as RF and plasma displays for high definition televisions, motor control, power supplies, automotive and high voltage lamp ballasts, and class-E converters for lamp ballasts with. Past reservations to implement LDMOST with BV above 1200V which were traditionally not practical for their large specific on-resistance may now be re-evaluated due to the reduced on-resistance of SJ-LDMOST with high aspect ratio SJ-pillars.

In contrast to conventional LDMOST on SOI which are limited by the buried oxide thickness, SJ-LDMOST on insulator substrate have no limitations on the BV voltage (i.e. the BV does not saturate) which is determined by the drift region length. Dielectrically isolated devices with BV above 860V may now be implemented in this technology.

The invention has been described with reference to certain preferred embodiments thereof. It will be understood, however, that modification and variations are possible within the scope of the appended claims. The SJ-LDMOST performance relies on achieving high aspect ratio SJ pillars with matching doping profiles. Technologies such as silicon trench etching by RIE and refilling by selective epitaxial growth of silicon or polysilicon may effectively exploit the full advantages of the SJ-LDMOST. MeV ion implantation which is being used presently to implement buried layer to alleviate latchup problems in CMOS technology may also be utilized to implement high aspect ratio pillars.

What is claimed is:

1. A lateral semiconductor device comprising:
   an insulating substrate;
   a first semiconductive layer formed on the insulating substrate; and
   a lateral power integrated circuit device formed in the semiconductive layer, having a superjunction drift region formed with a plurality of alternating heavily doped n pillars and p pillars;
   wherein the insulating substrate consists essentially of an insulating material capable of preventing substrate-assisted-depletion.

2. The lateral semiconductor device as claimed in claim 1, wherein the insulating substrate is composed of $Al_2O_3$ and the first semiconductive layer is composed of silicon.

3. The lateral semiconductor device as claimed in claim 1, wherein the insulating substrate is composed of quartz and the first semiconductive layer is composed of silicon.

4. The lateral semiconductor device as claimed in claim 1, wherein the insulating substrate is composed of $SiO_2$ and the first semiconductive layer is composed of silicon.

5. The lateral semiconductor device as claimed in claim 1, wherein the insulating substrate is composed of $\alpha Al_2O_3$ and the first semiconductive layer is composed of a single crystal silicon film having a crystallographic orientation of (100).

6. A lateral semiconductor device comprising:
   an insulting substrate;
   a first semiconductive layer formed on the insulating substrate;
   a lateral power integrated circuit device formed in the semiconductive layer, having a superjunction drift region formed with a plurality of alternating heavily doped n pillars and p pillars; and
   a second semiconductive layer formed underneath the insulating substrate,
   wherein the second semiconductor layer is selectively removed in a region which is directly underneath the lateral device.

7. The lateral semiconductor device as claimed in claim 6, wherein the insulating substrate is composed of $SiO_2$ and the first and second semiconductive layers are composed of silicon.

* * * * *